(12) United States Patent
Beck

(10) Patent No.: US 8,334,166 B2
(45) Date of Patent: Dec. 18, 2012

(54) DEPOSITION CHAMBER CLEANING SYSTEM AND METHOD

(75) Inventor: Markus E. Beck, Scotts Valley, CA (US)

(73) Assignee: First Solar, Inc., Perrysburg, OH (US)

( * ) Notice: Subject to any disclaimer, the term of this patent is extended or adjusted under 35 U.S.C. 154(b) by 0 days.

(21) Appl. No.: 13/044,255

(22) Filed: Mar. 9, 2011

(65) Prior Publication Data

US 2011/0223710 A1 Sep. 15, 2011

Related U.S. Application Data

(60) Provisional application No. 61/312,083, filed on Mar. 9, 2010.

(51) Int. Cl.
*H01L 31/18* (2006.01)
*B08B 9/00* (2006.01)
(52) U.S. Cl. .................................. 438/95; 134/22.1
(58) Field of Classification Search ...................... None
See application file for complete search history.

(56) References Cited

U.S. PATENT DOCUMENTS 5,779,757 A * 7/1998 Sanghera et al. ............... 65/389

* cited by examiner

*Primary Examiner* — Seahvosh Nikmanesh
(74) *Attorney, Agent, or Firm* — Dickstein Shapiro LLP

(57) ABSTRACT

An in-situ method of cleaning a vacuum deposition chamber can include flowing at least one reactive gas into the chamber.

7 Claims, 7 Drawing Sheets

DEPOSITION CHAMBER CLEANING SYSTEM AND METHOD

CLAIM OF PRIORITY

This application claims priority to U.S. Provisional Patent Application No. 61/312,083, filed on Mar. 9, 2010, which is incorporated by reference in its entirety.

TECHNICAL FIELD

This invention relates to a system and method of cleaning a deposition chamber.

BACKGROUND

Deposition methods can result in film growth not only covering the substrate to be coated, but also the reaction chamber walls and shields. For example, a first precursor can form a layer on a deposition chamber surface and can react with a second precursor to form a layer of a material on a deposition chamber surface. This, in turn, can lead to build up of deposits on the chamber walls and shields over time.

DETAILED DESCRIPTION

Figure 1:
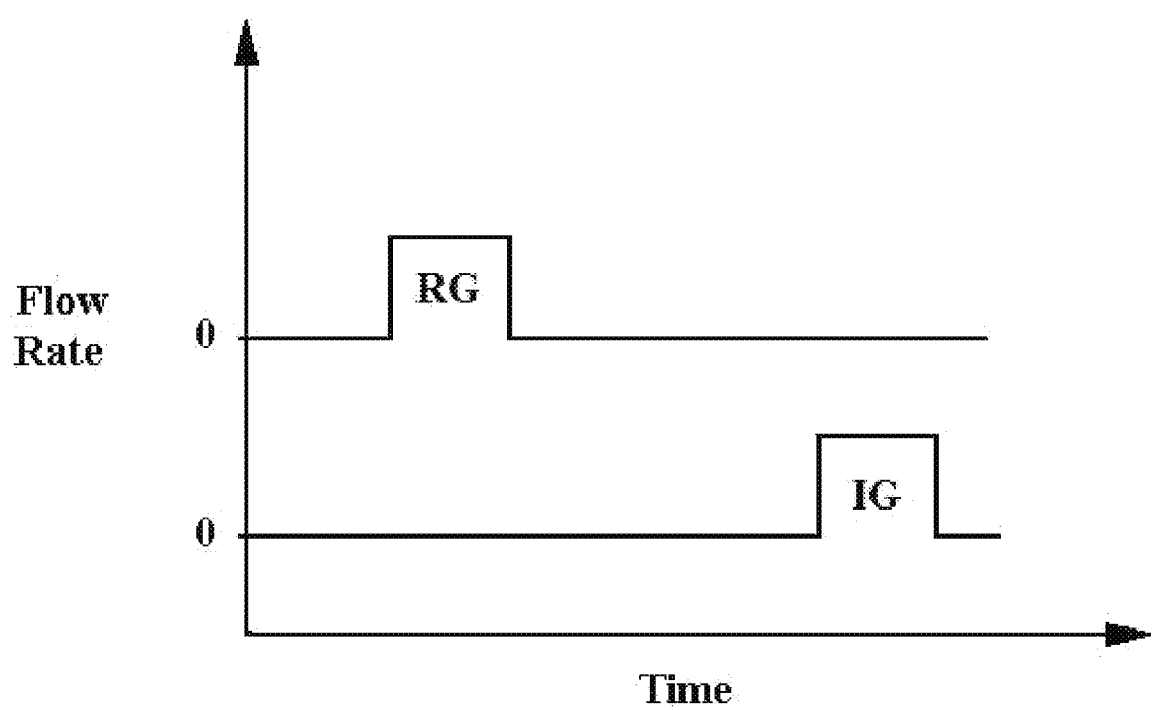
FIG. 1 is a schematic depicting the gas pulse sequence of a manufacturing process.

Atomic layer deposition (ALD) is a thin film deposition technique that is based on the sequential use of a gas phase chemical process. By using ALD, film thickness depends only on the number of reaction cycles, which makes the thickness control accurate and simple. Unlike chemical vapor deposition (CVD), there is less need of reactant flux homogeneity, which gives large area (large batch and easy scale-up) capability, excellent conformality and reproducibility, and simplifies the use of solid precursors.

Manufacturing a semiconductor device can include a thin film deposition process. Many deposition methods inadvertently result in film growth not only covering the substrate to be coated, but also the reaction chamber walls and shields. For example, in an atomic layer deposition or chemical vapor deposition, all surfaces suitable to allow for adsorption of the first precursor and providing conditions to allow the chemical reaction to occur with the second precursor. This can inadvertently result in film growth not only covering the substrate to be coated, but also the reaction chamber walls and shields. At some point deposition build up on the walls and shields reaches a critical thickness where film stress results in delamination. The ensuing flaking particles are typically undesirable and impact the film to be grown on the substrate. Thus, the walls and shields need to be cleaned periodically.

Cleaning is typically done by removing the shields and cleaning them either mechanically (e.g. bead blasting, brushing) or through chemical immersion. These cleaning procedures can adversely affect a reduction in equipment availability (uptime). In order for a deposition process to be an economically viable process in volume manufacturing applications, it is desirable to minimize equipment downtime associated with cleaning. One approach to minimizing cleaning downtime is to simplify the process of removing and replacing shields. These fast-change shields can be effective in reducing preventative maintenance down time. However, further improvement is required for cost effective deposition process, particularly in cost sensitive applications. A new method and system are developed to address cleaning deposition chamber surfaces coated with deposition materials.

An in-situ deposition chamber cleaning method can be used to remove the deposit build-up by deposition processes such as ALD and CVD. Examples, of films formed by such deposition processes can include metal chalcogenides. Examples of metal chalcogenides formed on deposition chamber surfaces include aluminum oxide ($Al_2O_3$), aluminum sulfide ($Al_2S_3$), aluminum selenide ($Al_2Se_3$) (or combinations thereof), indium oxide ($In_2O_3$), indium sulfide ($In_2S_3$), indium selenide ($In_2Se_3$) (or combinations thereof), or zinc oxide (ZnO), zinc sulfide (ZnS), or zinc selenide (ZnSe) (or combinations thereof), or titanium oxide ($TiO_2$), titanium sulfide ($TiS_2$), or titanium selenide ($TiSe_2$) (or combinations thereof). The in-situ cleaning method can clean the chamber wall and shield, without removal of the shields from the reactor. A goal of this in-situ cleaning method is to provide for more frequent cleaning cycles thereby reducing the particle generation and associated yield and process performance problems. Another goal of this alternate cleaning method is to improve deposition tool availability by providing a fast chamber cleaning method that does not require tool downtime. Specifically, it can clean the chamber chemically in-situ rather than mechanically or chemically ex-situ. In some embodiments, a reactive gas, such as gas phase hydrogen chloride (HCl), can be flown through the reactor. The reactive gas can include any suitable gas that can react with the deposits on the chamber walls and shields in such a way as to remove the deposited film.

In one aspect, a method of cleaning a deposition chamber can include pulsing a reactive gas including a hydrogen halide into a deposition chamber containing a metal chalcogenide formed on a deposition chamber surface to form a purgable material. The method can include purging the purgable material from the deposition chamber.

The purgable material can include forming a vapor. The purgable material can include a particulate. The hydrogen halide can include hydrogen chloride, hydrogen bromide, hydrogen iodide, or hydrogen fluoride. Purging the purgable material from the deposition chamber can include pulsing an inert gas into the deposition chamber to flush the purgable material out of the chamber. The method can include heating the deposition chamber to maintain the purgable vapor material as a vapor. The method can include introducing a chemically reactive plasma into the deposition chamber to react with metal chalcogenide.

The method can include pulsing a second reactive gas into the deposition chamber after pulsing the reactive gas into the deposition chamber. The second reactive gas can include oxygen. The second reactive gas can include an acid. The second reactive gas can include fluorine. The second reactive gas can include tetrafluoromethane.

As mentioned above, purging the purgable material from the deposition chamber can include pulsing an inert gas into the deposition chamber. The inert gas can include helium. The inert gas can include nitrogen.

In another aspect, a method of manufacturing a semiconductor device can include transporting a substrate into a deposition chamber and forming a buffer layer adjacent to the substrate. Forming the buffer layer can include pulsing at least one metal precursor and pulsing at least one chalcogen precursor into the chamber. The method can include transporting the substrate with the deposited buffer layer out of the chamber. The method can include pulsing a reactive gas including a hydrogen halide into the deposition chamber to react with a metal chalcogenide formed on a deposition chamber surface to form a purgable material. The method can include purging the purgable material from the deposition chamber. The method can include purging the chalcogen precursor before pulsing the reactive gas into the deposition chamber.

The purgable material can include a vapor. The purgable material can include a particulate. The hydrogen halide can include hydrogen chloride, hydrogen bromide, hydrogen iodide, or hydrogen fluoride. Purging the purgable material from the deposition chamber can include pulsing an inert gas into the deposition chamber to flush the purgable material out of the chamber. The method can include heating the deposition chamber to maintain the purgable vapor material as a vapor. The method can include forming a chemically reactive plasma in the deposition chamber to react with metal chalcogenide.

The method can include pulsing a second reactive gas into the deposition chamber after pulsing the reactive gas. The second reactive gas can include an acid, oxygen, fluorine, or tetrafluoromethane. As mentioned above, purging the purgable material from the deposition chamber can include pulsing an inert gas into the deposition chamber. The inert gas can include helium or nitrogen. The method can include heating the substrate before pulsing a precursor. The semiconductor device can include a photovoltaic device.

In another aspect, a system for cleaning a metal chalcogenide residue from a deposition chamber surface can include a deposition chamber including an interior surface, a deposition gas inlet, a reactive gas inlet, an inert gas inlet, and an outlet. The system can include a reactive gas source connected to the reactive gas inlet and configured to deliver a reactive gas including a hydrogen halide to the deposition chamber, where the reactive gas can react with a metal chalcogenide formed on the interior surface to form a purgable material. The system can include an inert gas source connected to the inert gas inlet and configured to deliver an inert gas to the deposition chamber and flush a purgable material from the deposition chamber through the outlet.

The metal chalcogenide can include aluminum, indium, zinc, or titanium. The metal chalcogenide can include oxygen, sulfur, or selenium. The hydrogen halide can include hydrogen chloride, hydrogen bromide, hydrogen iodide, or hydrogen fluoride. The system can include a second reactive gas source including an acid, oxygen, fluorine, or tetrafluoromethane. The inert gas source can include nitrogen or helium. The system can include heater to heat the deposition chamber interior surface to a temperature sufficient to maintain a purgable material as a vapor.

Referring to FIG. 1, a typical cycle of in-situ clean process can include two pulses of gas: a pulse of reactive gas (cleaning) and a pulse of inert gas (purging).

As shown below, a reactive gas (RG in FIG. 1), such as gas phase hydrogen chloride (HCl), can be pulsed into the deposition chamber to react with and remove the metal chalcogenide deposit:

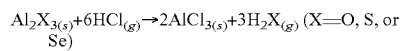

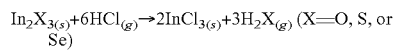

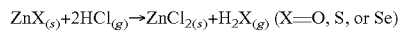

The reactant from such a reaction can be a solid. Hence, in some embodiments, the cleaning temperature and gas can be selected to assure that the resulting solid will have a vapor pressure high enough to be in the gas phase. Indium chloride (e.g., $InCl_3$), for example, sublimes at approximately 300° C. while its melting point is 586° C. Alternatively, in other embodiments, the particles can be small enough to be flushed through with the purging inert gas (IG in FIG. 1) before the next deposition cycle. This can be achieved not only by the temperature, but also the concentration of the cleaning gas. Dilution of the cleaning gas can be the applicable variable. The frequency and duration of the cleaning cycles can be adjusted to the deposition process and sensitivity to particles. Furthermore, following the cleaning gas injection the purge duration can be adjusted to assure that all of the cleaning gas has been flushed from the reaction chamber.

In some embodiments, the cleaning process can include a reactive ion etch (RIE) process. Reactive ion etching (RIE) is an etching technology widely used in microfabrication. It can use chemically reactive plasma to remove material deposited on chamber walls and shields. The plasma can be generated under low pressure (vacuum) by an electromagnetic field. High-energy ions from the plasma can attack the deposit build-up on the surface and react with it.

The in-situ cleaning method can include any suitable dry etch technique and process. The in-situ cleaning method can include providing chemically reactive plasma to facilitate removing of the deposited residue. The reactive gas can include oxygen, hydrogen, chlorine, or fluorine. The reactive gas can include tetrafluoromethane.

Thin film deposition is widely used in semiconductor device manufacturing, such as photovoltaic device manufacturing. Photovoltaic devices can include multiple layers formed on a substrate (or superstrate). For example, a photovoltaic device can include a conducting layer, a semiconductor absorber layer, a buffer layer, a semiconductor window layer, and a transparent conductive oxide (TCO) layer, formed in a stack on a substrate. Each layer may in turn include more than one layer or film. Each layer can cover all or a portion of the device and/or all or a portion of the layer or substrate underlying the layer. For example, a "layer" can mean any amount of any material that contacts all or a portion of a surface. As a result, the manufacturing process can include a plurality of thin film deposition process. The in-situ cleaning process can be implemented as often as every deposition cycle. It is more likely that cleaning would be performed periodically after some total deposition time (or thickness) as determined by process and uptime optimization for a given deposition chemistry and process.

Advantageously, in this in-situ cleaning method, the chamber temperature can be maintained at or near process temperatures during the cleaning, thereby eliminating the time that it takes for the system to cool and then re-heat as a result of normal ex-situ cleaning. Another feature of this in-situ cleaning method is that the chamber environment does not need to be opened to air and subsequently purged of airborne process contaminants such as unwanted oxygen, carbon, water vapor, hydrocarbons and etc.

Figure 2:
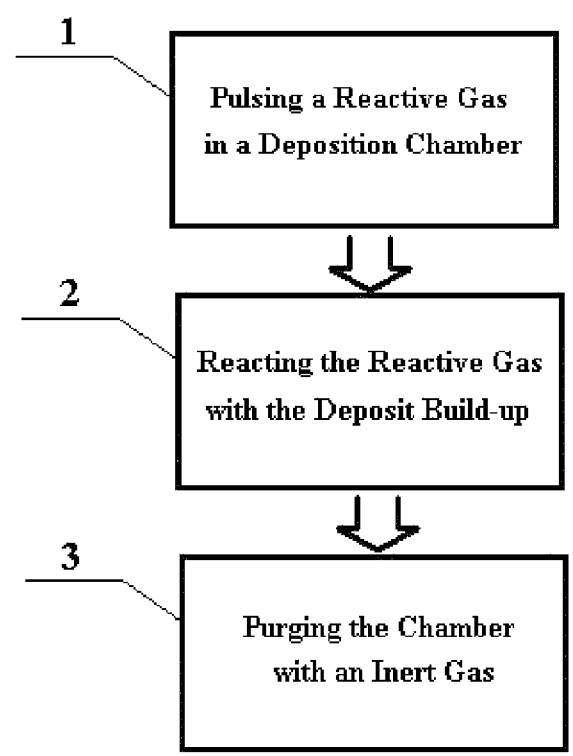
FIG. 2 is a flowchart depicting the steps of a method for cleaning a deposition chamber.

Referring to FIG. 2, an in-situ method for cleaning a deposition chamber can include the steps of: 1) pulsing a reactive gas in a deposition chamber; 2) reacting the reactive gas with the deposit build-up; 3) purging the chamber with an inert gas.

Figure 3:
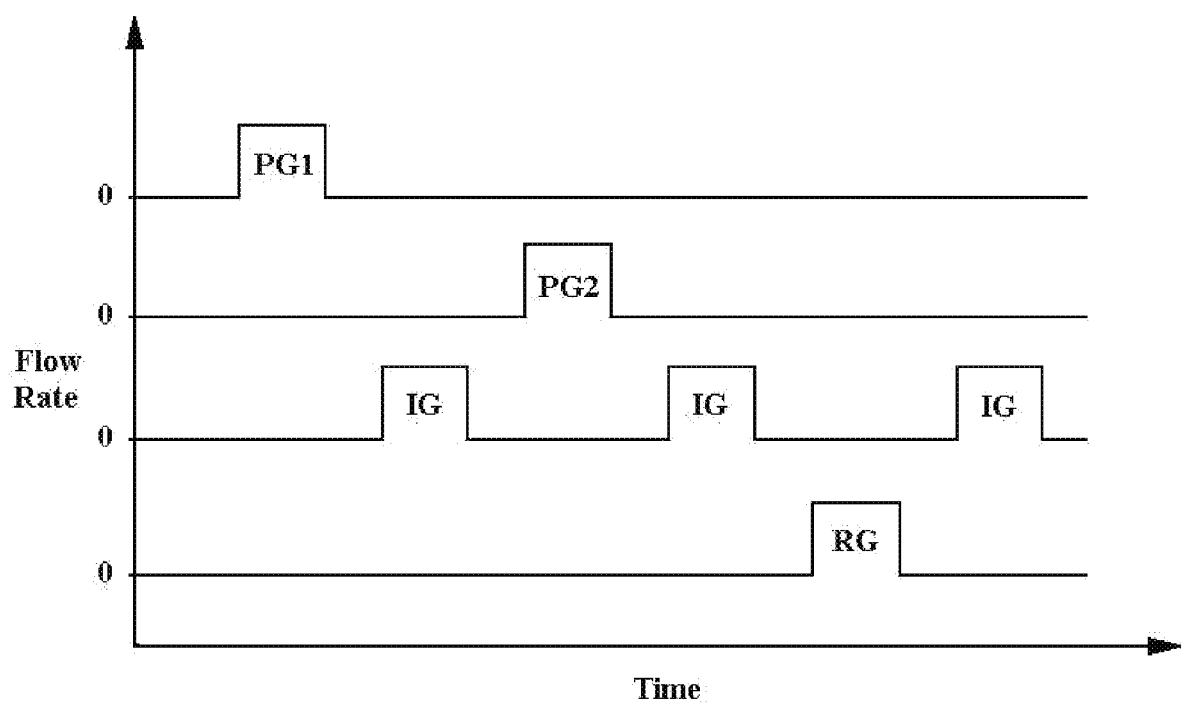
FIG. 3 is a schematic depicting the gas pulse sequence of a manufacturing process.

Referring to FIG. 3, an in-situ cleaning cycle can follow an ALD deposition cycle. For example, metal precursor gas flow (PG1) can be introduced into the chamber, and adsorb and react with the surface. The dose of the metal precursor gas can be adjusted to obtain surface saturation, i.e. all available processing surface sites can be used for reaction with the precursor. When it is obtained, the precursor inlet can be closed and the chamber purged with inert gas (IG) leaving only the layer of reacted species on the processing surface. Chalcogen precursor (PG2) is then introduced and react with the first layer forming a monolayer of the desired material (e.g. a metal chalcogenide for a buffer layer) while the byproducts desorb and are pumped out. The chamber can be purged again with inert gas (IG). This pulsing sequence corresponds to one ALD cycle. The sequence can be repeated up to a desired or predetermined number of cycles and the thickness can be controlled on a monolayer level. The substrate with the deposited film can then be transported from the chamber. If the substrate remains in the deposition chamber, the reactive gas pulsed into the deposition chamber can react with the metal chalcogenide layer formed thereon and can remove the intended metal chalcogenide layer. Therefore, the substrate can be removed before the reactive gas is pulsed.

When the reactive gas (RG), such as gas phase hydrogen chloride (HCl), is pulsed, it can be flowed through the reactor to react with and remove the metal chalcogenide deposit on the chamber walls and shields. The resulting particles can be small enough to be flushed through with the purging inert gas (IG) before the next deposition cycle. The in-situ cleaning cycle can be repeated till the existence of deposit residue in the chamber is reduced to a level that will not negatively effect the following deposition cycle. The reactive gas step can be repeated between each substrate, or between multiples of substrates on which a metal chalcogenide layer is deposited. For example, the reactive gas step can be carried out once for every two to five substrates treated. The reactive gas step can be carried out once for every 5 to 10 substrates treated. The reactive gas step can be carried out at any suitable interval to achieve the optimal balance of deposition chamber condition and down-time. Down-time can be minimized by maximizing the number of substrates processed between each reactive gas treatment. The number of substrates processed between each reactive gas treatment can be increased to minimize downtime. For example, the reactive gas step can be carried out as infrequently as once for every 2,000 or fewer (e.g., about 1,000) substrates.

The reactive gas can include any suitable gas. For example, the reactive gas can include a hydrogen halide, such as hydrogen chloride. The reactive gas can be diluted with any suitable gas such as an inert gas. Examples of inert gases that can be used to dilute the reactive gas can include helium and nitrogen. The reactive gas can be diluted with any other suitable gas, including a second reactive gas.

Figure 4:
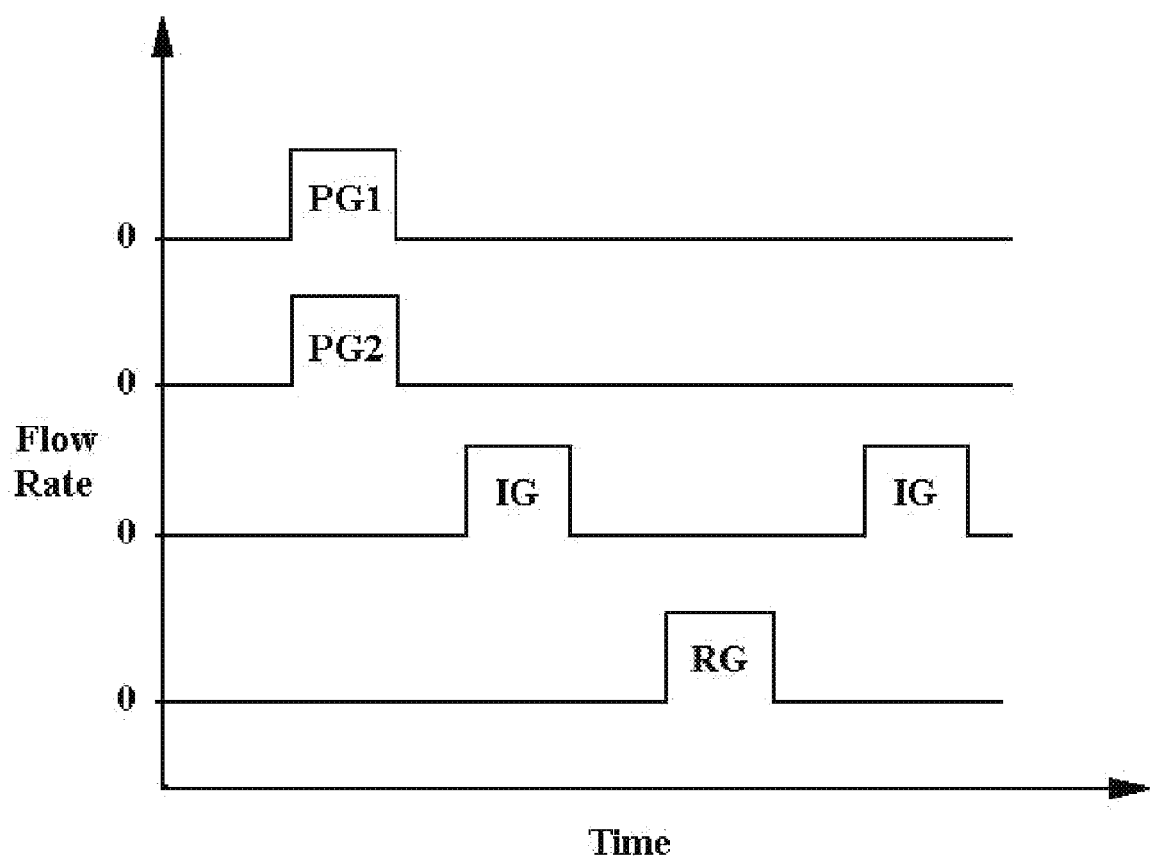
FIG. 4 is a schematic depicting the gas pulse sequence of a manufacturing process.

Referring to FIG. 4, an in-situ cleaning cycle can follow a deposition cycle, such as a CVD deposition cycle. For example, at least two precursor gas flow (PG1 and PG2) can be introduced into the chamber, react and/or decompose on the substrate surface to produce the desired deposit. When the deposition is done, the precursor inlet can be closed and the chamber purged with inert gas (IG) displacing the precursor gas from the chamber. This pulsing sequence corresponds to one CVD cycle. The sequence can be repeated up to a desired or predetermined number of cycles and the thickness can be controlled on a monolayer level. The substrate with the deposited film can then be transported from the chamber.

After that, reactive gas (RG), such as gas phase hydrogen chloride (HCl), can be flown through the reactor to react with and remove the deposit. The resulting particles can be small enough to be flushed through with the purging inert gas (IG) before the next deposition cycle. The in-situ cleaning cycle can be repeated till the existence of deposit residue in the chamber is reduced to a level that will not negatively effect the following deposition cycle.

Figure 5:
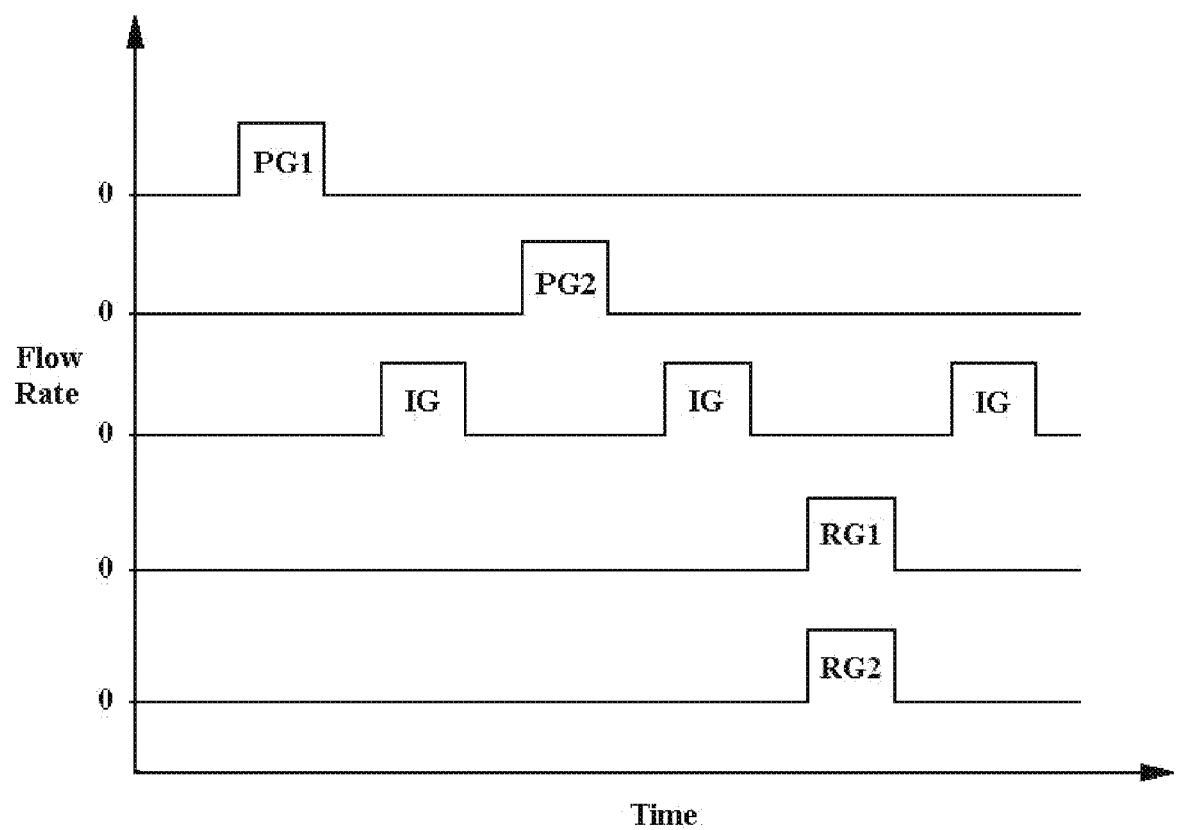
FIG. 5 is a schematic depicting the gas pulse sequence of a manufacturing process.
Figure 6:
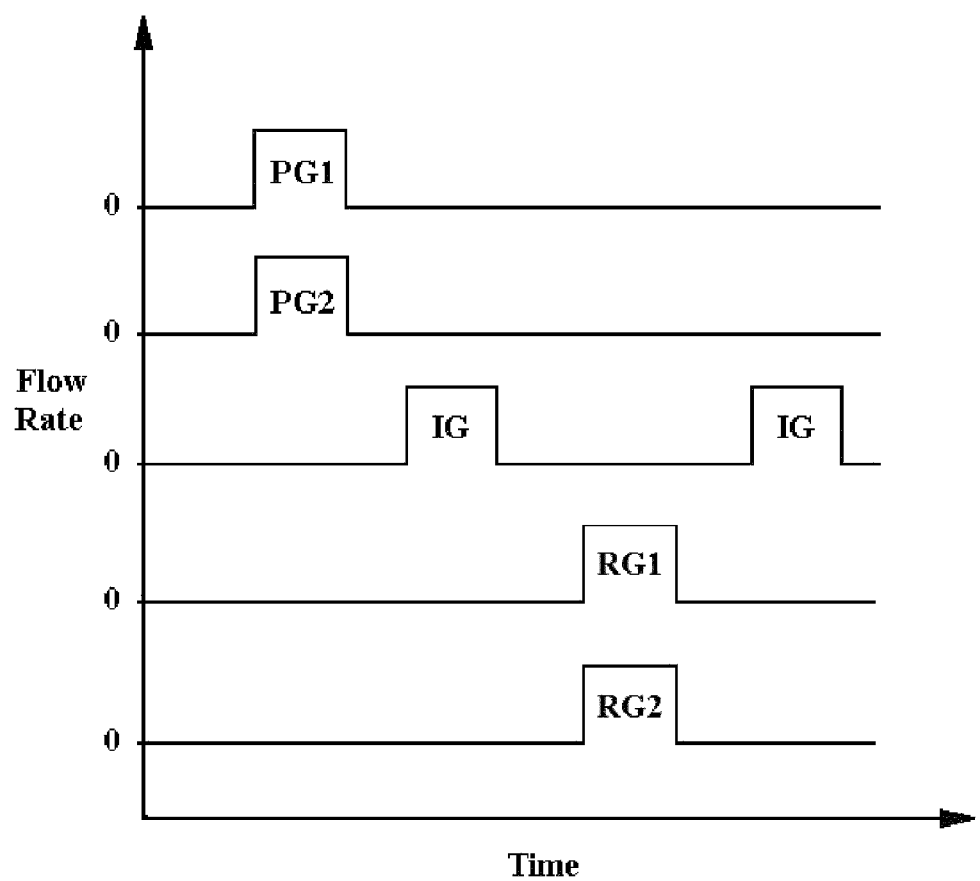
FIG. 6 is a schematic depicting the gas pulse sequence of a manufacturing process.

Referring to FIGS. 5 and 6, more than one reactive gas (RG1 and RG2) can be introduced to the chamber for in-situ cleaning process. For example, depending on the deposit residue need to be removed, the reactive gas can include a combination of gas phase etchants, such as $CF_4/O_2$, $SF_6/O_2$, or $BCl_3/Cl_2$. The in-situ cleaning method can also be used to clean the deposit build-up by any other applicable deposition process, such as evaporation or sputtering.

Figure 7:
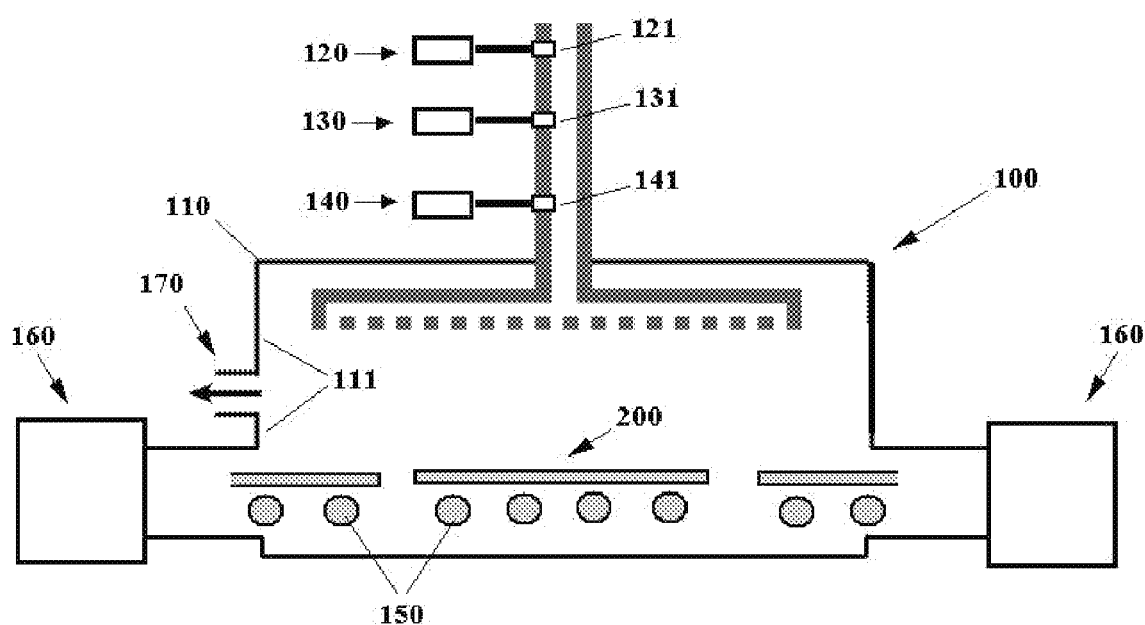
FIG. 7 is a schematic depicting a deposition system.

Referring to FIG. 7, deposition system 100 can include apparatus for cleaning a metal chalcogenide residue from a deposition chamber surface. Deposition system 100 can include deposition chamber 110 having interior surface 111, deposition gas inlet 121, reactive gas inlet 131, inert gas inlet 141, and outlet 170. Deposition gas source 120 can be connected to deposition gas inlet 121 and configured to deliver a deposition gas to deposition chamber 110. Reactive gas source 130 can be connected to reactive gas inlet 131 and configured to deliver a reactive gas to deposition chamber 110. The reactive gas can react with a metal chalcogenide formed on interior surface 111 to form a purgable material. Inert gas source 140 can be connected to inert gas inlet 141 and configured to deliver an inert gas to deposition chamber 110 and flush a purgable material from deposition chamber 110 through outlet 170.

Deposition system 100 can include conveyor 150 to transport substrate 200 into and out of deposition chamber 110. Loadlock 160 can be installed at the both ends of conveyor 150 to control the deposition and cleaning process.

A number of embodiments of the invention have been described. Nevertheless, it will be understood that various modifications may be made without departing from the spirit and scope of the invention. It should also be understood that the appended drawings are not necessarily to scale, presenting a somewhat simplified representation of various preferred features illustrative of the basic principles of the invention.

What is claimed is:

1. A system for cleaning a metal chalcogenide residue from a deposition chamber surface, comprising:
   a deposition chamber comprising an interior surface, a deposition gas inlet, a reactive gas inlet, an inert gas inlet, and an outlet;
   a reactive gas source connected to the reactive gas inlet and configured to deliver a reactive gas comprising a hydrogen halide to the deposition chamber, where the reactive gas can react with a metal chalcogenide formed on the interior surface to form a purgable material;
   an inert gas source connected to the inert gas inlet and configured to deliver an inert gas to the deposition chamber and flush a purgable material from the deposition chamber through the outlet.

2. The system of claim 1, wherein the metal chalcogenide comprises a material selected from the group consisting of aluminum, titanium, indium, and zinc.

3. The system of claim 1, wherein the metal chalcogenide comprises a material selected from the group consisting of oxygen, sulfur, and selenium.

4. The system of claim 1, wherein the hydrogen halide comprises hydrogen chloride.

5. The system of claim 1, further comprising a second reactive gas source comprising a second reactive gas comprising a material selected from the group consisting of an acid, oxygen, fluorine, and tetrafluoromethane.

6. The system of claim 1, wherein the inert gas source comprises a material selected from the group consisting of nitrogen and helium.

7. The system of claim 1, further comprising a heater to heat the deposition chamber interior surface to a temperature sufficient to maintain a purgable material as a vapor.

* * * * *